United States Patent [19]

Mahoney

[11] 4,214,966
[45] Jul. 29, 1980

[54] PROCESS USEFUL IN THE FABRICATION OF ARTICLES WITH METALLIZED SURFACES

[75] Inventor: Gerard E. Mahoney, Branchburg, N.J.

[73] Assignee: Bell Telephone Laboratories, Incorporated, Murray Hill, N.J.

[21] Appl. No.: 22,186

[22] Filed: Mar. 20, 1979

[51] Int. Cl.² .................................................. C23C 15/00
[52] U.S. Cl. .............................. 204/192 E; 156/643; 427/38
[58] Field of Search ..................... 204/192 EC, 192 E; 250/492, 492 A, 492 B; 427/38, 43, 88; 156/643

[56] References Cited

U.S. PATENT DOCUMENTS

| | | | |
|---|---|---|---|
| 3,860,783 | 1/1975 | Schmidt et al. | 219/121 EM |
| 4,004,341 | 1/1977 | Tung | 29/571 |
| 4,016,062 | 4/1977 | Mehta et al. | 204/192 E |
| 4,093,503 | 6/1978 | Harris et al. | 156/628 |

OTHER PUBLICATIONS

Sumio Hosaka et al., Influence of Sample Inclination and Rotation During Ion-Beam Etching, *J. Vac. Sci. Technol.*, vol. 15, No. 5, Sep./Oct., 1978, pp. 1712–1717.

*Primary Examiner*—John H. Mack
*Assistant Examiner*—William Leader
*Attorney, Agent, or Firm*—Bruce S. Schneider

[57] ABSTRACT

A method has been devised for metallizing a desired area on a substrate during the manufacture of semiconductor devices. This process includes the steps of depositing a material such as a polymer resist on the substrate to delineate the area to be metallized. Then a suitable metal is deposited onto the coated substrate leaving a metallic film on both the exposed area of the substrate and on the delineating material. This metallic film is then substantially removed only from the delineating material by a technique which includes ion milling at an acute angle to the plane of the substrate. Conventional techniques are then employed to remove the delineating material.

10 Claims, 5 Drawing Figures

PROCESS USEFUL IN THE FABRICATION OF ARTICLES WITH METALLIZED SURFACES

BACKGROUND OF THE INVENTION

1. Field of the Invention

This invention relates to a process for fabricating semiconductor devices and, more particularly, to a process for depositing a metal film on a desired area of a semiconductor substrate.

2. Art Background

The fabrication of semiconductor devices often requires the deposition of a narrow, e.g., a few microns in dimension, metallic strip in a precisely defined area on a semiconductor substrate. Additionally, these narrow strips often must be quite thick relative to their width. For example, when high frequency field effect transistors (FETs) are manufactured the gate must be narrower than two microns and must be positioned between two ohmic contacts which form the source and drain. The use of a gate wider than a few microns necessitates an excessive distance between the drain and source and makes the device impractically large while degrading electrical characteristics. Additionally, the gate is usually at least one micron high. If a thinner gate is used, its resistance would be unacceptably high and degraded device performance would occur.

Typically in fabrication of devices such as FETs, the area of a substrate to be metallized is first delineated by covering all of the substrate except this area with a protective material, i.e., a delineating material. For example, a substrate is covered with a photoresist material which is exposed and developed to remove the resist from the selected areas of the substrate. The impracticality of aligning a resist or other delineating material relative to a previously deposited narrow metal layer such as is found in FETs requires that all metallization be done in a single processing step. That is, the entire metallization process must be completed before the delineating, e.g. photoresist, layer is removed.

Other problems arise from the impracticality of delineating material realignment. For example, as the delineated area of the substrate is metallized, metal is also deposited on the original delineating material. This layer of metal when thicker than one micron, as necessitated for certain devices, e.g. gates in FETs, substantially hinders the removal of this delineating material by typical solvent technique. Since, as discussed previously, metal layers and thus the deposits on the delineating material are often thicker than one micron, solvent techniques are usually unavailing for removal of the resist layer after metallization. Therefore, other removal techniques must be employed. However, other techniques, such as using a chemical reactant which removes the metal from the resist, also remove the metallized layer in the delineated area. To protect the desired metallization requires the positioning of a second resist or other delineating material onto the metal in the defined area. As discussed, however, the repositioning of a resist layer is not practical for metallizations having narrow widths.

A lift-off technique has been developed for use in fabricating narrow metallized areas. In this technique, a material which delineates the area to be metallized is deposited on an appropriate substrate. Aluminum is then deposited by conventional techniques such as evaporation onto the substrate. This deposited aluminum area is not controlled precisely. Not only the delineated area of the substrate, but also the entire surface of the delineating material is coated with a metallic layer. For substantially all common metals, this metallic layer covering the delineated material would prevent its removal where the metallization is greater than about one micron thick. (Thicknesses less than one micron as previously mentioned are unacceptable for many applications.) However, aluminum does not form a continuous film. Cracks in the aluminum surface allow introduction of a suitable liquid to remove the underlying delineated material.

In a typical process, a photolithography resist, such as AZ resist, is deposited on a semiconductor substrate to delineate a desired area for metallization. Aluminum is then evaporated onto the substrate surface. The AZ resist and its aluminum coating is then removed by using a solvent for the resist such as acetone.

Although aluminum metallization is essential for the lift-off process, there are many drawbacks associated with its use. For example, aluminum is very reactive and, therefore, acids cannot be used in any of the subsequent processing steps. Aluminum also reacts with gold to form an alloy composition which has unacceptable electrical properties for semiconductor devices. This reaction prevents the use of gold electrical contacts to the metallized aluminum layer. Since gold is a preferred contact in semiconductor technology, this is also a limitation. Additionally, most conventional techniques for depositing aluminum lead to a somewhat grainy morphology. This graining when severe leads to destruction of the device when a suitable electrical potential is applied.

Despite the problems associated with the use of aluminum, this metal continues to be used because of its unique adaptability to the lift-off process. Although other metals would be preferable in many semiconductor devices their impermeability for typical metallization thicknesses makes the use of the lift-off process unavailing. Thus, when the dimensions of the surface to be metallized require a single deposition step, without realignment, the inconvenience of aluminum metallized layers has been necessitated.

SUMMARY OF THE INVENTION

A metallization process has been developed using a variety of metals. This process first requires delineating a desired area of a substrate followed by deposition of a metal or metals onto the delineated area by conventional techniques such as evaporation. After the deposition step, the metal coating on the surface of the delineating material is ion milled. This ion milling is performed so that the ion beam intersects the substrate at an acute angle. After ion milling, the delineating material is than removed by conventional techniques.

Various metals such as platinum have been used in the metal layer. Indeed, multilayer metallization such as sequential deposition of platinum, titanium platinum, and gold layers have been deposited without realignment. The delineating material is then removed in accordance with the subject invention. In particular, GaAs FETS which use a gate deposited by the subject process exhibit excellent electrical properties.

DETAILED DESCRIPTION

The subject invention for pedagogic reasons will be described in terms of depositing a gate for a FET device. It should be understood that the process is practical for the metallizing of any delineated area on a substrate. The process does not depend on the particular substrate material or the particular metal to be deposited on that substrate. The only requirement is that a convenient method of depositing an adherent metal layer on the substrate is available. Nevertheless, the most practical application for this technique presently is in semiconductor device fabrication and, therefore, it will be described within this framework.

Figure 2:
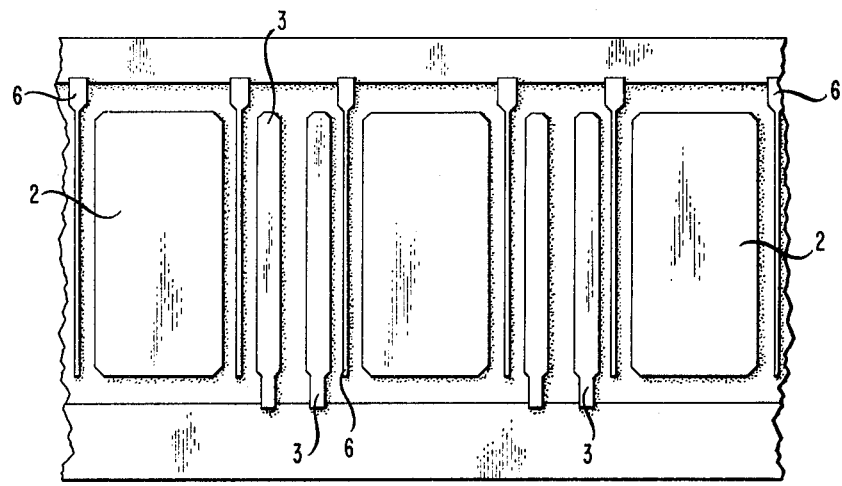
FIG. 2 is a representation of an exemplary device which is advantageously manufactured by the subject invention.

Typically, in the fabrication of semiconductor devices, the substrate is first cleaned by conventional techniques and then ohmic contacts are made in the appropriate areas. For example, in the case of a FET, ohmic contacts are made for the sources and drains, 3 and 2 respectively in FIG. 2. In practical applications, one substrate has a number of mesas formed on it and on each mesa a plurality of sources and drains are deposited as a precursor to a finished device. Although it is understood that this multiple device fabrication is the conventional practice, the remainder of the specification will be in terms of the processing of a single mesa from a substrate having ohmic contacts for the drain and source to the final finished device.

Once the drains and sources are deposited by conventional fabrication techniques the gate structures, 6, must be deposited approximately an equal distance between these two electrode structures. The first step in depositing the gate structure is to delineate the area of the substrate where the metallization for the gate is to be positioned. The choice of delineating material is not critical. However, because photolithographic techniques are rapid and reliable, it is advantageous to use a photoresist for the delineating material. In the preferred embodiment, a positive photoresist is deposited over the entire substrate. A mask is then aligned with the substrate so that the transparent areas of the mask are positioned directly over the areas on the substrate where the gates are ultimately to be deposited. Light of suitable wavelength to expose the resist is directed onto the mask and in turn exposes the resist beneath.

Figure 3:
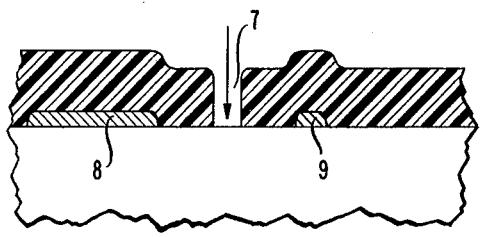
FIG. 3, 4, and 5 illustrate the milling step of the subject process.

Once the resist is exposed, it must be developed. This is done by conventional techniques. Resists in general use have an associated chemical developing agent. The techniques for using this agent are well-known. After development of the resist, or any other delineating material, only the area on the substrate which is to be metallized is exposed. At this point, the substrate appears as shown in FIG. 3 where 7, 9 and 8 denominate the area on the substrate to be metallized, the source and drain respectively. (Note in FIG. 3, the area to be metallized which ultimately forms the gate structure is oversized merely for clarity of depiction.)

The desired metal is then deposited onto the exposed areas of the substrate. Conventional techniques such as evaporation are used for this deposition step. As discussed earlier, the thickness and the width of the gate area depends on the device being fabricated. For FETs, the gates are typically one to two microns thick and 1½ to 2½ microns wide. The thickness of the resist deposited on the substrate initially should be approximately the same or thicker than the metal to be deposited and after development should delineate an area of the appropriate width.

The gate need not be comprised of a single metal element. The subject invention is equally adaptable to multilayer deposition. For example, when a GaAs substrate is utilized the gate is advantageously formed by deposition of successive layers of platinum, titanium, platinum, and gold. For GaAs substrates, platinum forms an excellent Schottky barrier. However, platinum reacts with the GaAs. Therefore, the initial platinum layer is in this case limited to less than 300 Å in thickness. The titanium layer deposited on the platinum prevents excessive reaction with the initial platinum metallization by separating it from the succeeding platinum layer. The second platinum layer positioned on the titanium prevents chemical interaction with the final gold layer. This final gold layer is utilized since external electrical contact are easily made to it. The process does not depend on a particular choice for the metal composition and other metal combinations and alloys are useful.

Figure 4:
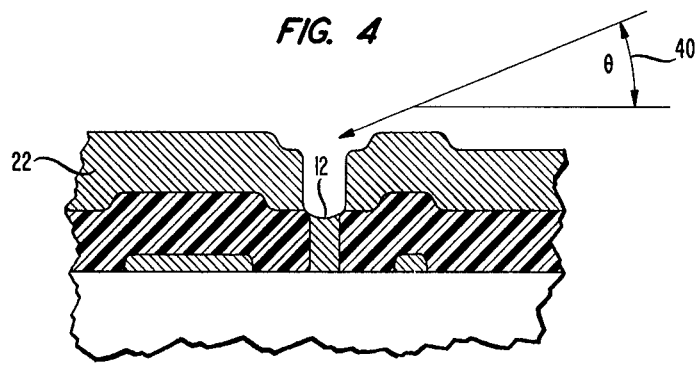
Figure 5:
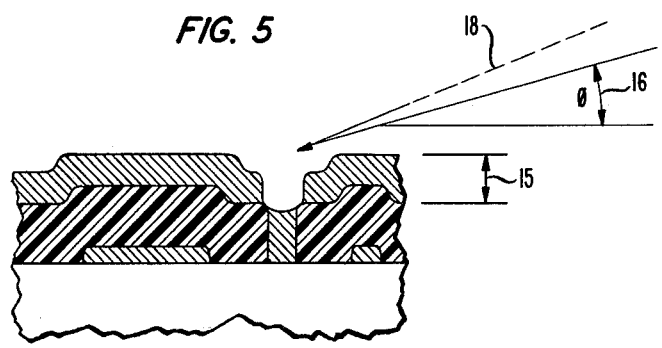

For conventional metal deposition techniques, it is difficult to control the exact area of deposition. Therefore, metal is deposited both on the exposed area of the substrate and also on the surface of the adjoining delineating material. As discussed earlier, this metal coating on the resist surface prevents the removal of the delineating material. In the subject invention, the removal of the metal with its underlying delineating material is effected by milling the metal from the delineating material with an ion beam. The ion beam must be directed so that it removes the metal which coats the delineating material and not substantially affect the metal which is deposited on the exposed are of the substrate. (It should be noted that for some applications, e.g., GaAs FETs, some milling of the desired metallized area is acceptable. The extent of this milling naturally depends on the application. For example, in one embodiment of a FET a Pt/Ti/Pt/Au metallization is utilized. The Au layer for adequate current carrying capability should generally be at least 1 μm thick. Thus, if initially a Au thickness of greater than 1 μm is employed some ion milling of the Au surface (down to 1 μm at the narrowest point) is tolerable. The criterion is that the ion milling of the metal surface should be limited to an amount which does not affect the desired properties of this layer.) This requires that the angle of incidence of the ion beam denominated 40 in FIG. 4 is sufficiently small to substantially prevent its impingence in metallization layer 12. As can be seen in FIG. 4, the thicker the metal layer 22, on the resist the larger the angle 40 can be without adversely affecting the metallization area. However, as the metal on the delineating material is removed, for example, to a level denoted 15 in FIG. 5, the necessary angle 16 to prevent erosion of the metallization layer becomes smaller. (This is shown by dotted line 18 in FIG. 5 which indicates the allowable angle at the initiation of the milling process.) The maximum allowable angle between the ion beam and the surface of the substrate is computed geometrically by considering the thickness of the metal layer on the resist material (this thickness is approximately equal to the thickness of the metallized region on the substrate) and by knowing the width of the metallized area on the substrate. For area dimensions which are practically delineated angles of greater than 80 degrees between the ion beam and the substrate are generally not desirable.

The rate of milling increases proportionately with the angle made between the ion beam and the substrate surface. Therefore, it is preferable to mill at the largest angle which does not cause substantial degradation of the metallized area. For example, a metallized area having a thickness of 1.5 μm and a width of 2.0 μm would require initially an ion beam angle of approximately less than 35 degrees. As the metal on the delineating material is removed, it is desirable to reduce the milling angle so that the desired metal area is not adversely affected. Again, it is preferable to maintain the milling angle at as large a value within this constraint. Typically, for most applications milling angles of between 30 degrees and 8 degrees are useful. Angles less than 5 degrees are much less practical because the milling rate becomes very slow.

Some metals do not ion mill well. Their use is thus somewhat restricted in the subject process. However, it is possible to use such metals if thier thickness is limited. For example, titanium is very difficult to ion mill. However, if thicknesses of the titanium layer is less than 500 Å, preferably less than 3000 Å, these layers are effectively removed by chemical etching. For example, in one embodiment of the subject invention when platinum, titanium, platinum, and gold is deposited the metallization layer on the delineating material is milled down to the titanium layer, this layer is then removed chemically. When such metals are employed, the top layer of the metallized substrate must be essentially inert to the chemical used in removing the ion milling resistant metal to prevent removal to the desired metallized area.

The particular ion used for milling is not critical. For most applications a noble gas such as argon is suitable. If the substrate or the ion beam is held stationary during processing, the area of the ion beam used should be commensurate with the area to be ion milled. The current density of the ion beam is a factor in determining the rate of removal of the metal. For practical processing times current densities of between 200 $\mu a/cm^2$ and 500 $\mu a/cm^2$ are desirable. Current densities greater than 500 $\mu a/cm^2$ result in excessively fast removal rates with associated heating problems while current densities less than 200 $\mu a/cm^2$ are too slow for many applications.

After the metal layer is removed, the delineating material is stripped from the substrate by conventional techniques. For example, in the case of photolithographic resists, a solvent for the resist material is sprayed on its surface to effect removal. It should be noted that all the metal on the delineating material need not be removed. When the remaining metal layer has a thickness less than 1000 Å, discontinuities in the film especially at step edges permits sufficient solvent to reach the delineating material and induce removal of the delineating material with its thin metal coating. Therefore, it is possible to terminate the ion milling process, if desired, when the remaining metal on the delineating material has a thickness less than 1000 Å.

Once the delineating material is removed contact to the metallized area is made by conventional techniques such as attaching wires by thermal compression bonding. The following example illustrates the processing parameters necessary.

EXAMPLE 1

A gallium arsenide substrate with source and drain was prepared as described in Niehaus et al, *Institute of Physics Conference* Series 336, Chapter 5 (1977). This substrate was lapped so that it was approximately 15 mils thick. A layer of AZ resist (a positive photolithographic resist which is a proprietary product of Shipley Company, Inc., Newton, Mass.) was deposited on the gallium arsenide substrate in approximately a uniform layer having a thickness of 1.5 microns. The resist was exposed through a chrome photolithographic mask held in contact with the resist surface. (The mask was aligned so that a 2 μm wide and 250 mm long transparent region was positioned over the approximate midpoint between the drain and source.) After this exposure, the AZ resist was developed with a proprietary developer furnished by the manufacturer of the resist. The resist was then rinsed in distilled water, blown dry with dried nitrogen, and was baked in a nitrogen atmosphere at 80 degrees C for 20 minutes. This procedure left a delineated area having a width of approximately two microns and a length of approximately 250 microns. The exposed area was then etched to reduce the active area in the substrate below the metallized area so that desired for the ultimate application of the device.

Figure 1:
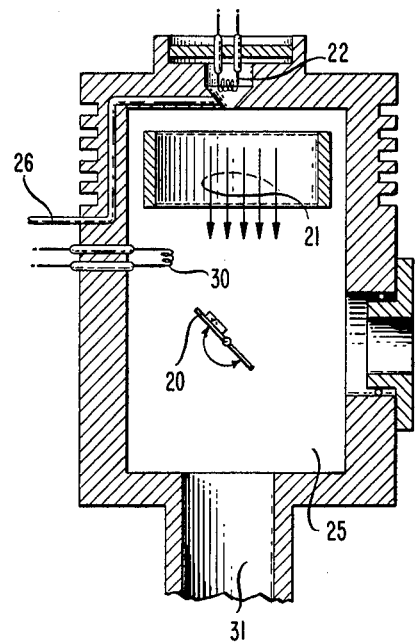
FIG. 1 is a schematic representation of an apparatus useful in the practice of the subject inventive process.

After the etching step, the device was soaked in a 1 to 50 mixture of HCl in water for one minute and then spun dry. Successive layers of platinum, titanium, platinum and gold were evaporated onto the substrate thereby covering both the exposed area of the gallium arsenide as well as the surface of the resist material. These four metal layers had thicknesses respectively of 300 Å, 2,000 Å, 2,000 Å, and 10,000 Å. During the evaporation of each metal, the thickness of the particular metal being deposited was monitored with a quartz crystal monitoring device. The metals deposited onto the exposed gallium arsenide surface filled the trench formed by the resist material so that the top of the layers deposited on the exposed gallium arsenide were approximately level with the surface of the resist material. The metallized substrate was placed in a holder, 20, of an ion mill apparatus (FIG. 1). This holder is equipped so that it could be rotated and also inclined relative to the axis of the ion beam. The substrate was then positioned so that the ion beam, 21, was directed perpendicular to the larger dimension of the gate, i.e., the 250 micron length so that the narrow dimension of the delineating material is perpendicular to the ion beam axis, and so that the beam made an angle of approximately 20 degrees with the plane of the major surface of the substrate. The holder was rotated 180 degrees periodically (with the beam shuttered) to insure uniform milling. (The beam was produced at heater, 22, by thermal ionization of an argon gas flow through tube 26. The chamber was evacuated to $5 \times 10^{-6}$ Torr through port, 31. Sufficient argon was used so that the pressure during operation was $10^{-4}$ Torr.) An argon ion beam having a current density of 375 $\mu a/cm^2$ and a cross-section of 17 cm in diameter was directed at the substrate through a chamber 25. The milling was continued until the gold metal layer had been removed. (It is possible to neutralize the argon beam during milling to prevent charge build up. This is done by heating wire, 30, which emits electrons that neutralize the argon. Neutralization helps prevent charge build up on the substrate with the associated possibility of beam deflection. However, it was found to be an unnecessary precaution in this example and was not utilized.) The angle of the beam relative to the substrate was then reduced to 8 degrees. Milling was continued until the titanium layer on the resist material was clearly visible. (The angle of the ion beam was changed before milling to the titanium layer to insure that the gate was still adequately protected from the ion beam by the progessively thinning metal layer on the resist material.) For convenience, the substrate was then removed from the ion milling apparatus and the remaining thickness of titanium dissolved by immersing the substrate in a 1 to 20 solution of HF in water. This immersion removed the titanium which was deposited over the resist material, but did not affect the titanium layer in the gate area because of its protective gold layer.

The substrate was then rinsed thoroughly in distilled water. The resist material was lifted off by spraying acetone onto the substrate. (The remaining platinum layer did not hinder this process since it was only 300 Å thick.) The devices formed have excellent electrical properties, i.e., for devices having 6 mm of gate width, output powers of 5 watts with 8db of gain were obtained at 4GHZ.

I claim:

1. A process for depositing metallic material to form a metallic layer on a prescribed area of a substrate comprising the steps of masking the regions of said substrate bounding said area with a delineating material, depositing said metallic material, and removing said delineating material with its coating of said metallic material from said substrate CHARACTERIZED IN THAT the method of removing said delineating material comprises the step of removing at least a portion of said metallic material deposited on said delineating material by ion milling said deposited metallic material at an acute angle to said substrate such that said metallic layer on said prescribed area is substantially unaffected.

2. The process of claim 1 wherein said deposited metallic material comprises successively deposited layers of platinum, titanium, platinum, and gold.

3. The process of claim 1 wherein said acute angle is in the range 30 degrees to 8 degrees.

4. The process of claim 1 wherein said substrate is gallium arsenide.

5. The process of claim 4 wherein said deposited metallic material includes successively deposited layers of platinum, titanium, platinum, and gold.

6. The process of claim 1 wherein said delineating material is a polymeric resist.

7. The process of claim 6 wherein said polymeric resist is a photolithographic resist.

8. The process of claim 6 including the removal of said delineating material after said ion milling by solvation.

9. The process of claim 1 wherein said acute angle is sufficiently small to prevent any removal of said metallic layer deposited on said prescribed area.

10. The process of claim 1 wherein said acute angle is less than 80 degrees.

* * * * *

UNITED STATES PATENT AND TRADEMARK OFFICE
CERTIFICATE OF CORRECTION

PATENT NO. : 4,214,966

DATED : July 29, 1980

INVENTOR(S) : Gerard E. Mahoney

It is certified that error appears in the above-identified patent and that said Letters Patent are hereby corrected as shown below:

Column 4, line 37, "are" should read --area--; line 53, "in" should read --from--. Column 5, line 22, "thier thickness" should read --their thickness--; line 24, "500 Å" should read --5000 Å--; line 65, "conventinal" should read --conventional--. Column 7, line 7, "progessively" should read --progressively--; line 23, "I claim" should read --Claims--.

Signed and Sealed this

Twelfth Day of May 1981

[SEAL]

Attest:

RENE D. TEGTMEYER

*Attesting Officer*  *Acting Commissioner of Patents and Trademarks*